United States Patent
Zelinski et al.

(10) Patent No.: US 8,085,046 B2
(45) Date of Patent: Dec. 27, 2011

(54) COIL ARRAY MODE COMPRESSION FOR PARALLEL TRANSMISSION MAGNETIC RESONANCE IMAGING

(75) Inventors: Adam C Zelinski, Watertown, MA (US); Lawrence L Wald, Cambridge, MA (US); Elfar Adalsteinsson, Belmont, MA (US); Vivek K Goyal, Cambridge, MA (US); Vijay Alagappan, Somerville, MA (US)

(73) Assignee: The General Hospital Corporation, Boston, MA (US)

( * ) Notice: Subject to any disclaimer, the term of this patent is extended or adjusted under 35 U.S.C. 154(b) by 307 days.

(21) Appl. No.: 12/550,074

(22) Filed: Aug. 28, 2009

(65) Prior Publication Data
US 2010/0052679 A1    Mar. 4, 2010

Related U.S. Application Data

(60) Provisional application No. 61/092,579, filed on Aug. 28, 2008.

(51) Int. Cl.
*G01V 3/00* (2006.01)
(52) U.S. Cl. ........................................ 324/309
(58) Field of Classification Search .......... 324/300–322; 600/407, 410, 419–422
See application file for complete search history.

(56) References Cited

U.S. PATENT DOCUMENTS

| | | | | |
|---|---|---|---|---|
| 7,518,364 | B1* | 4/2009 | Cukur | 324/309 |
| 7,705,594 | B2* | 4/2010 | Xu et al. | 324/307 |
| 7,737,690 | B2* | 6/2010 | Xu et al. | 324/307 |
| 7,800,368 | B2* | 9/2010 | Vaughan et al. | 324/318 |
| 7,944,206 | B2* | 5/2011 | Frydman et al. | 324/307 |
| 2009/0256570 | A1* | 10/2009 | Zelinski et al. | 324/314 |
| 2010/0066361 | A1* | 3/2010 | Setsompop et al. | 324/309 |
| 2010/0066362 | A1* | 3/2010 | Ullmann | 324/309 |
| 2010/0136929 | A1* | 6/2010 | Vernickel et al. | 455/91 |
| 2010/0253338 | A1* | 10/2010 | Eryaman et al. | 324/309 |

* cited by examiner

*Primary Examiner* — Brij Shrivastav
(74) *Attorney, Agent, or Firm* — Quarles & Brady LLP

(57) ABSTRACT

A method for target-dependent, sparsity-enforced selection for choosing a substantially optimal connection of radiofrequency ("RF") transmitters to the elements of the RF coil array is provided. In particular, a method is provided that selects the linear combinations of the "N" spatial mode profiles of a transmission RF coil array, such that the k-space trajectory and pulse duration acceleration capabilities of the array are advantageously utilized. A sparsity-enforcement method that determines a subset of the available spatial modes for a parallel transmission RF coil array is employed to this end. In this manner, the utilization of the encoding power of a highly-parallel N-mode coil array in a system with only "P" available excitation channels is enabled.

14 Claims, 4 Drawing Sheets

COIL ARRAY MODE COMPRESSION FOR PARALLEL TRANSMISSION MAGNETIC RESONANCE IMAGING

CROSS-REFERENCE TO RELATED APPLICATIONS

This application claims the benefit of, and herein incorporates by reference in its entirety, U.S. Provisional Patent Application Ser. No. 61/092,579 filed on Aug. 28, 2008, and entitled "Coil Array Mode Compression for Parallel Transmission Magnetic Resonance Imaging."

STATEMENT REGARDING FEDERALLY SPONSORED RESEARCH

This invention was made with United States government support awarded by the following agency: National Institutes of Health R01EB006847 and R01EB007942. The United States government has certain rights in this invention.

BACKGROUND OF THE INVENTION

The field of the invention is magnetic resonance imaging ("MRI") methods and systems. More particularly, the invention relates to the production of spatially-selective RF excitation pulses using parallel RF transmit systems.

When a substance such as human tissue is subjected to a uniform magnetic field (polarizing field $B_0$), the individual magnetic moments of the nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped", into the x-y plane to produce a net transverse magnetic moment M. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically-proven pulse sequences and they also enable the development of new pulse sequences.

The MR signals acquired with an MRI system are signal samples of the subject of the examination in Fourier space, or what is often referred to in the art as "k-space". Each MR measurement cycle, or pulse sequence, typically samples a portion of k-space along a sampling trajectory characteristic of that pulse sequence. Most pulse sequences sample k-space in a raster scan-like pattern sometimes referred to as a "spin-warp", a "Fourier", a "rectilinear", or a "Cartesian" scan. The spin-warp scan technique employs a variable amplitude phase encoding magnetic field gradient pulse prior to the acquisition of MR spin-echo signals to phase encode spatial information in the direction of this gradient. In a two-dimensional implementation ("2DFT"), for example, spatial information is encoded in one direction by applying a phase encoding gradient, $G_y$, along that direction, and then a spin-echo signal is acquired in the presence of a readout magnetic field gradient, $G_x$, in a direction orthogonal to the phase encoding direction. The readout gradient present during the spin-echo acquisition encodes spatial information in the orthogonal direction. In a typical 2DFT pulse sequence, the magnitude of the phase encoding gradient pulse, $G_y$, is incremented, $\Delta G_y$, in the sequence of measurement cycles, or "views" that are acquired during the scan to produce a set of k-space MR data from which an entire image can be reconstructed.

There are many other k-space sampling patterns used by MRI systems. These include "radial," or "projection reconstruction" scans, in which k-space is sampled as a set of radial sampling trajectories extending from the center of k-space. The pulse sequences for a radial scan are characterized by the lack of a phase encoding gradient and the presence of a readout gradient that changes direction from one pulse sequence view to the next. There are also many k-space sampling methods that are closely related to the radial scan and that sample along a curved k-space sampling trajectory rather than the straight line radial trajectory.

An image is reconstructed from the acquired k-space data by transforming the k-space data set to an image space data set. There are many different methods for performing this task and the method used is often determined by the technique used to acquire the k-space data. With a Cartesian grid of k-space data that results from a 2D or 3D spin-warp acquisition, for example, the most common reconstruction method used is an inverse Fourier transformation ("2DFT" or "3DFT") along each of the 2 or 3 axes of the data set. With a radial k-space data set and its variations, the most common reconstruction method includes "regridding" the k-space samples to create a Cartesian grid of k-space samples and then performing a 2DFT or 3DFT on the regridded k-space data set. In the alternative, a radial k-space data set can also be transformed to Radon space by performing a 1 DFT of each radial projection view and then transforming the Radon space data set to image space by performing a filtered backprojection.

Hardware costs and complexity typically limit the number of transmit channels available for use in parallel transmission MRI. Thus, in sharp contrast to parallel reception MRI, where 32 channel receive systems are available in the clinic and 128 channels systems are available for research, the most advanced parallel transmission systems typically only have P=8 channels. As a result, there are often fewer radiofrequency ("RF") transmitters available than there are RF coil array elements, and a decision must be made as to how the transmitters are to drive the more numerous RF coil array elements. The number of choices can be very large considering that linear combinations of RF coil array elements, rather than just a single coil element, can be driven by each RF transmitter. For example, there are upwards of 12,870 possible ways to connect 8 RF transmitters to a 16 element coil array. Moreover, the RF excitation field produced by a multi-element coil array is dependent on its structure. For example, the spatial information in a transmission array having N=16 RF excitation coil elements is determined by the $B_1$ magnetic field pattern produced by each of those coils. Thus, the ability of a parallel transmission system to take advantage of this information depends on the degree to which these $B_1$ field patterns are spatially distinct and provide non-redundant spatial information to the RF excitation.

One way of analyzing the utility of the spatial information provided by a particular coil array for parallel transmission applications is to perform a principle component analysis ("PCA") on the spatial profiles of the coil elements. PCA is a method that analyzes the linear combinations of the spatial profiles and forms a set of linear combinations, referred to as the "modes" of the coil array, that are orthogonal. Formally, such orthogonal profiles are the eigenvectors of a covariance matrix that represents inter-profile and intra-profile relations among the original set of spatial profiles. As a result, these orthogonal modes are sometimes referred to as "eigenmodes." As a byproduct of the PCA method, a set of eigenvalues are produced that show the relative amount of RF energy contributed by each spatial mode. In the case where all modes contribute equally, that is, where the eigenvalues are all essentially equal in magnitude, the N-channel coil array is able to accelerate the transmit k-space trajectory N-fold. However, if, for example, an N=16 channel array has only five eigenmodes that have eigenvalues significantly greater than zero, then the array is only capable of accelerating the trajectory by a factor of five. This analysis has been used to analyze the spatial encoding power of arrays for accelerated imaging encoding on the data acquisition and image reconstruction side of the MR imaging experiment.

While PCA provides an effective method for determining optimal linear combinations of coil array spatial profiles that provide non-redundant spatial information, the method does not provide any information on how to build a hardware device that produces these non-redundant linear combinations. In practice, coil array elements are utilized as they are positioned in a coil array, or linear combinations of the analog outputs of the elements can be generated using a device such as a Butler matrix, which is described, for example, by J. Butler and R. Lowe in "Beamforming Matrix Simplifies Design of Electronically Scanned Antennas," Electron. Design, 1961; 9:170-173.

A Butler matrix produces a spatial basis set that is useful when dealing with common transmit array geometries. Using the Butler matrix type of RF transmit array, it is fairly straightforward, and inexpensive, to expand the number of elements on an RF coil array; therefore, many different modes are made available. However, while a large number of spatial mode profiles are available, adding additional RF transmit excitation channels to drive these modes is extremely costly. Each transmit channel, which is able to drive only a single mode profile, requires a digital RF generator, a high power RF amplifier, and a specific absorption rate safety monitor.

It would therefore be desirable to provide a method for identifying and forming linear combinations of spatial modes of an RF coil array having a limited number of RF transmission channels. Furthermore, it would be desirable to provide a method for selecting subsets of these modes such that they can be driven with the limited number of available RF transmit channels in order to form a user-defined spatially-tailored RF excitation pattern. In this manner, it would be possible to achieve greater parallel transmission acceleration while limiting the number of transmit coil elements.

SUMMARY OF THE INVENTION

The present invention overcomes the aforementioned drawbacks by providing a target-dependent, sparsity-enforced selection method for choosing a substantially near-optimal connection of the RF transmitters to the elements of the RF coil array. In particular, a method is provided for selecting the linear combinations of the N-spatial mode profiles of a transmission RF coil array in order to improve the k-space trajectory and pulse duration acceleration capabilities of the array. Thus, the utilization of the encoding power of a highly-parallel N-mode coil array in a system with only P available excitation channels is enabled.

It is an aspect of the invention to provide a sparsity-enforcement method that determines a subset of the available spatial modes for a parallel transmission RF coil array. The method allows MRI system users to specify a desired RF excitation field, and then determines a target-specific, customized P-element subset of the N spatial modes of the coil array to use in forming the desired excitation pattern. This is achieved by enforcing an $L_1$-norm penalty that penalizes nonzero mode energies. This promotes sparsity in the mode-usage dimension, revealing a small, sparse set of spatial modes that, along with an RF pulse, form a high-fidelity version of the desired user-specified RF excitation field. The method allows users to control the trade-off between excitation quality and the number of nonzero modes employed to produce the excitation.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
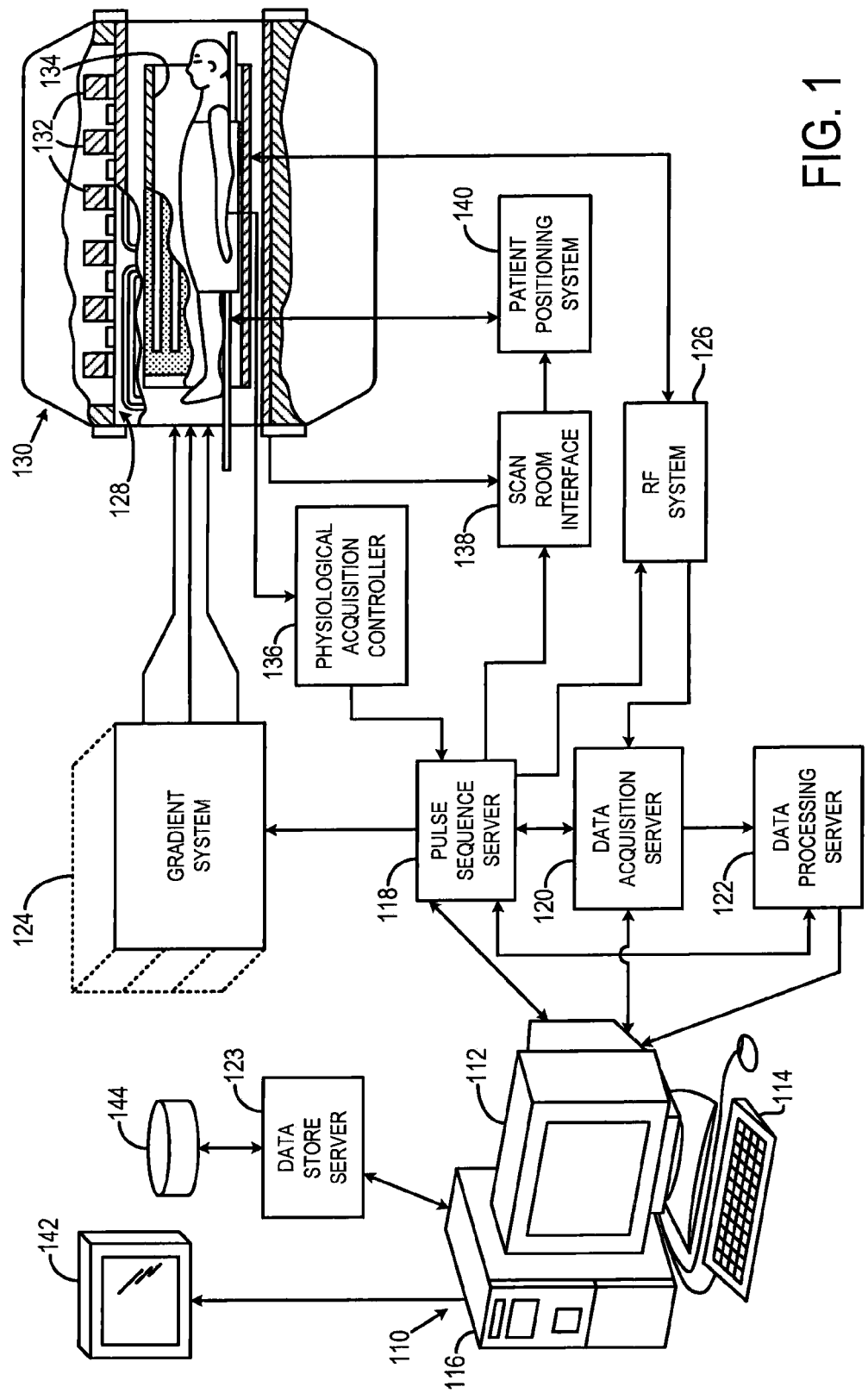
FIG. 1 is a block diagram of a magnetic resonance imaging ("MRI") system that employs the present invention.

Referring particularly to FIG. 1, the preferred embodiment of the invention is employed in a magnetic resonance imaging ("MRI") system. The MRI system includes a workstation 110 having a display 112 and a keyboard 114. The workstation 110 includes a processor 116 that is a commercially available programmable machine running a commercially available operating system. The workstation 110 provides the operator interface that enables scan prescriptions to be entered into the MRI system. The workstation 110 is coupled to four servers: a pulse sequence server 118; a data acquisition server 120; a data processing server 122, and a data store server 123. The workstation 110 and each server 118, 120, 122 and 123 are connected to communicate with each other.

The pulse sequence server 118 functions in response to instructions downloaded from the workstation 110 to operate a gradient system 124 and a radiofrequency ("RF") system 126. Gradient waveforms necessary to perform the prescribed scan are produced and applied to the gradient system 124 that excites gradient coils in an assembly 128 to produce the magnetic field gradients $G_x$, $G_y$, and $G_z$ used for position encoding MR signals. The gradient coil assembly 128 forms part of a magnet assembly 130 that includes a polarizing magnet 132 and a whole-body RF coil 134.

RF excitation waveforms are applied to the RF coil 134 by the RF system 126 to perform the prescribed magnetic resonance pulse sequence. Responsive MR signals detected by the RF coil 134 or a separate local coil (not shown in FIG. 1) are received by the RF system 126, amplified, demodulated, filtered and digitized under direction of commands produced by the pulse sequence server 118. The RF system 126 includes an RF transmitter for producing a wide variety of RF pulses used in MR pulse sequences. The RF transmitter is responsive to the scan prescription and direction from the pulse sequence server 118 to produce RF pulses of the desired frequency, phase and pulse amplitude waveform. The generated RF pulses may be applied to the whole body RF coil 134 or to one or more local coils or coil arrays (not shown in FIG. 1).

The RF system 126 also includes one or more RF receiver channels. Each RF receiver channel includes an RF amplifier that amplifies the MR signal received by the coil to which it is connected and a detector that detects and digitizes the I and Q quadrature components of the received MR signal. The magnitude of the received MR signal may thus be determined at any sampled point by the square root of the sum of the squares of the I and Q components:

$$M = \sqrt{I^2 + Q^2},$$

and the phase of the received MR signal may also be determined:

$$\phi = \tan^{-1}\left(\frac{Q}{I}\right).$$

The pulse sequence server 118 also optionally receives patient data from a physiological acquisition controller 136. The controller 136 receives signals from a number of different sensors connected to the patient, such as ECG signals from electrodes or respiratory signals from a bellows. Such signals are typically used by the pulse sequence server 118 to synchronize, or "gate", the performance of the scan with the subject's respiration or heart beat.

The pulse sequence server 118 also connects to a scan room interface circuit 138 that receives signals from various sensors associated with the condition of the patient and the magnet system. It is also through the scan room interface circuit 138 that a patient positioning system 140 receives commands to move the patient to desired positions during the scan.

The digitized MR signal samples produced by the RF system 126 are received by the data acquisition server 120. The data acquisition server 120 operates in response to instructions downloaded from the workstation 110 to receive the real-time MR data and provide buffer storage such that no data is lost by data overrun. In some scans the data acquisition server 120 does little more than pass the acquired MR data to the data processor server 122. However, in scans that require information derived from acquired MR data to control the further performance of the scan, the data acquisition server 120 is programmed to produce such information and convey it to the pulse sequence server 118. For example, during prescans MR data is acquired and used to calibrate the pulse sequence performed by the pulse sequence server 118. Also, navigator signals may be acquired during a scan and used to adjust RF or gradient system operating parameters or to control the view order in which k-space is sampled. And, the data acquisition server 120 may be employed to process MR signals used to detect the arrival of contrast agent in a magnetic resonance angiography (MRA) scan. In all these examples the data acquisition server 120 acquires MR data and processes it in real-time to produce information that is used to control the scan.

The data processing server 122 receives MR data from the data acquisition server 120 and processes it in accordance with instructions downloaded from the workstation 110. Such processing may include, for example: Fourier transformation of raw k-space MR data to produce two or three-dimensional images; the application of filters to a reconstructed image; the performance of a backprojection image reconstruction of acquired MR data; the calculation of functional MR images; the calculation of motion or flow images, etc.

Images reconstructed by the data processing server 122 are conveyed back to the workstation 110 where they are stored. Real-time images are stored in a data base memory cache (not shown) from which they may be output to operator display 112 or a display 142 that is located near the magnet assembly 130 for use by attending physicians. Batch mode images or selected real time images are stored in a host database on disc storage 144. When such images have been reconstructed and transferred to storage, the data processing server 122 notifies the data store server 123 on the workstation 110. The workstation 110 may be used by an operator to archive the images, produce films, or send the images via a network to other facilities.

Figure 2:
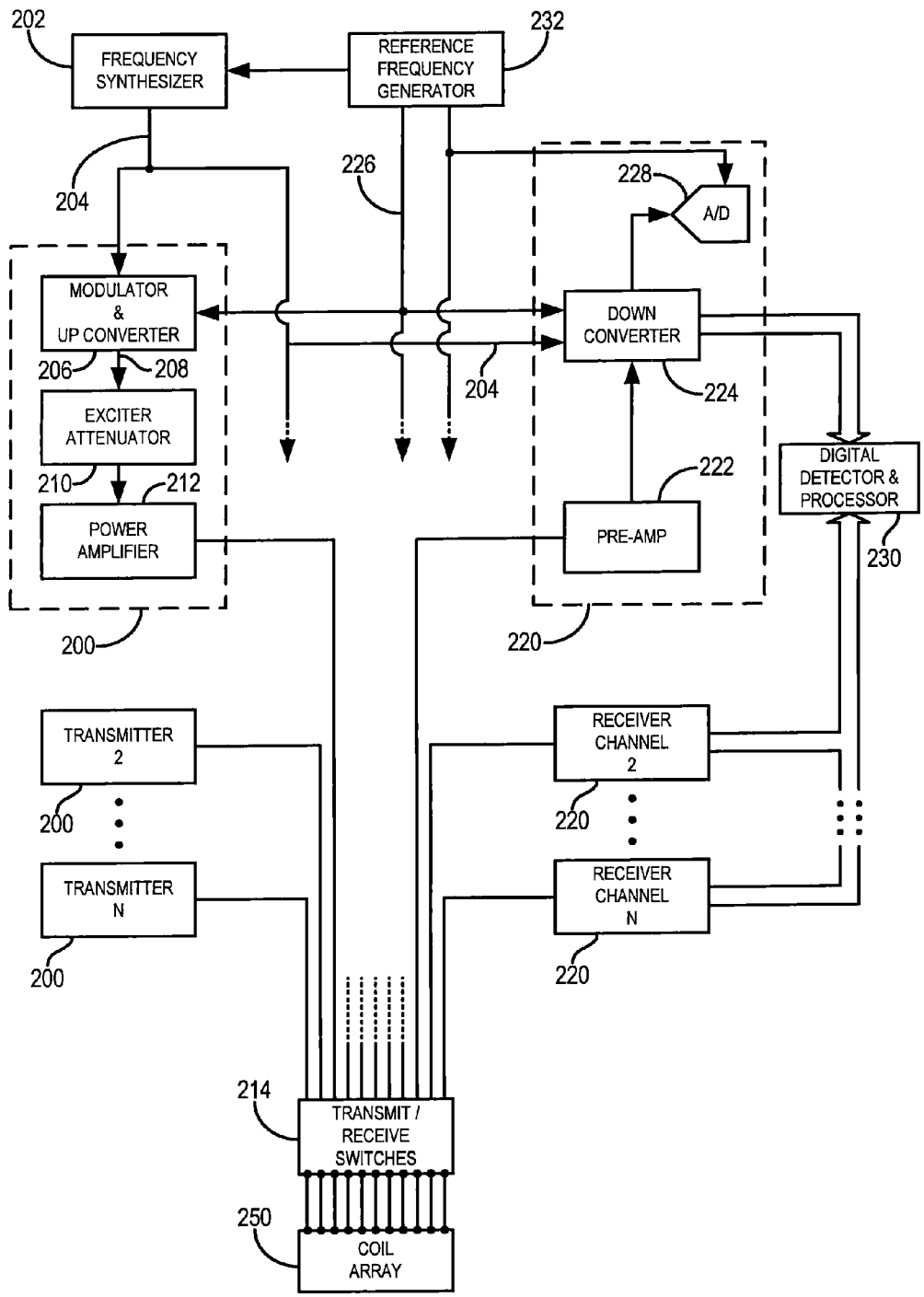
FIG. 2 is a block diagram of an RF system that forms part of the MRI system of FIG. 1.

Referring particularly to FIG. 2, the present invention employs a coil array 250 that includes a plurality of coil elements that can be separately driven by a plurality of RF transmitters to produce the prescribed RF field-of-excitation ("FOX"). The same coil array 250 can also be used as a plurality of receive channels, or in the alternative, the whole-body RF coil 134, or a local RF coil or additional array of receive coils, can be used to acquire the MR signals. Many different coil array structures 250 may be used with the present invention, which, in part, maps the $B_1^+$ radiofrequency ("RF") excitation field produced by each coil array element.

Referring particularly to FIG. 2, the RF system 126 includes a set of transmitters 200 that each produce a prescribed RF excitation field. The base, or carrier, frequency of this RF excitation field is produced under control of a frequency synthesizer 202 which receives a set of digital signals from the pulse sequence server 118. These digital signals indicate the frequency and phase of the RF carrier signal produced at an output 204. The RF carrier is applied to a modulator and up converter 206 in each transmitter 200 where its amplitude is modulated in response to a signal also received from the pulse sequence server 118. The signal defines the envelope of the RF excitation pulse to be produced and is produced by sequentially reading out a series of stored digital values. These stored digital values may, be changed to enable any desired RF pulse envelope to be produced by each transmitter 200.

The magnitude of the RF excitation pulse produced at output 208 is attenuated by an exciter attenuator circuit 210 in each transmitter 200, which receives a digital command from the pulse sequence server 118. The attenuated RF excitation pulses are applied to a power amplifier 212 in each transmitter 200. The power amplifiers are current source devices that connect to respective transmit inputs on a set of transmit/receive switches 214. By way of example, N transmitters 200 are employed and connected through N transmit/receive switches 214 to N coil elements in an RF coil array 200.

Referring still to FIG. 2 the signal produced by the subject is picked up by the coil array 250 and applied to the inputs of a set of receive channels 220. A pre-amplifier 222 in each receiver channel 220 amplifies the signal by an amount determined by a digital attenuation signal received from the pulse sequence server 118. The received signal is at or around the Larmor frequency, and this high frequency signal is down converted in a two step process by a down converter 224, which first mixes the NMR signal with the carrier signal on line 204 and then mixes the resulting difference signal with a reference signal on line 226. The down converter NMR signal is applied to the input of an analog-to-digital ("N/D") converter 228 which samples and digitizes the analog signal and applies it to a digital detector and signal processor 230, which produces 16-bit in-phase ("I") values and 16-bit quadrature ("Q") values corresponding to the received signal. The resulting stream of digitized I and Q values of the received signal are output to the data acquisition server 120. The reference signal as well as the sampling signal applied to the A/D converter 228 are produced by a reference frequency generator 232.

The transmit/receive switches 214 are operated by the pulse sequence server 118 to connect the N transmitters 200 to the N coil elements in the coil array 250 during those parts of the pulse sequence in which an RF field is to be produced. Each transmitter 200 is separately controlled by the pulse sequence server 118 to produce an RF field of a prescribed amplitude, frequency, phase and envelope at each of the N coil elements. The combined RF fields of the N coil elements produce the prescribed $B_1$ field throughout the region of interest in the subject during the imaging phase of the procedure.

When the $B_1$ field is not produced the pulse sequence server 118 operates the transmit/receive switches 214 to connect each of the N receive channels to the respective N coil elements. Signals produced by excited spins in the subject are picked up and separately processed as described above.

Parallel transmit systems reduce the duration of spatially-tailored excitation pulses by utilizing the coil array's spatial transmit patterns to allow under-sampling of excitation k-space. Linear combinations of coil array elements are formed so that the spatial modes of the coil array are transformed into a different basis set. This increases the transmission efficiency and acceleration capabilities of the coil array in a subset of the modes. The available transmit channels are then applied only to a subset of the coil array modes, which are chosen based on their contribution to transmission efficiency and encoding. When designing and choosing reception modes, the object being imaged is unknown and the choice of array modes is in turn based on general sensitivity and encoding considerations. However, in the transmit case, the desired excitation is not only know, but preferentially chosen in advance. Thus, it is useful to explicitly incorporate this information when selecting a mode subset.

The succeeding method includes a fast, target-dependent and sparsity-enforced mode subset selection ("SEMSS") method that accounts for the desired excitation pattern when choosing the mode subset. This method contrasts strongly with previous methods of principal component or covariance analysis, which only use the spatial profiles as inputs and thus determine only a single P-mode subset for all excitations.

By way of example, a situation is presented in which N=16 transmit modes, $S_n(r)$, of a stripline array in an orthogonal birdcage coil array are achieved by employing a Butler matrix. As described above, a Butler matrix produces a spatial basis set that is useful when dealing with common transmit array geometries. Using the Butler matrix type of RF transmit array, it is possible to expand the number of elements on the coil array, thereby making available many different modes. These sixteen modes include those with correct polarization for excitation, such as circularly-polarized ("CP") modes, and those with the opposite polarization, such as anti-circularly-polarized ("ACP") modes.

Figure 3A:
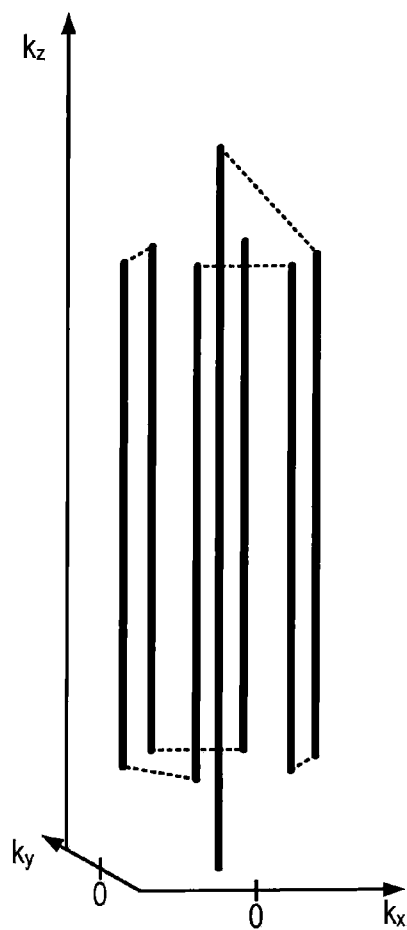
FIG. 3 is a pictorial representation of an exemplary set of k-space spokes.
Figure 3B:
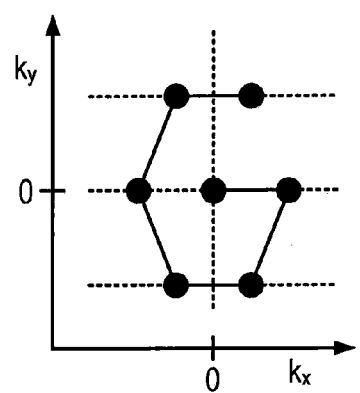

The choice of a subset of these possible modes may be substantially optimized for producing 3D spatially tailored excitations using, for example, a "spoke-based" pulse trajectory. Spoke-based RF excitation pulses are produced by weighted sinc-like segments in $k_z$ placed at different locations in $(k_x, k_y)$ using an echo-volume trajectory. An exemplary set of such k-space spokes is illustrated in FIGS. 3A and 3B. The sinc RF waveforms excite a slice in the z-direction, while amplitude and phase modulations along each spoke, which are interpreted as complex weights in $(k_x, k_y)$, tailor the in-plane excitation into a desired pattern. Fixing the $(k_x, k_y)$ placement of T spokes, along with spoke shape and gradients, in turn fixes the slice-selective properties of the pulse. A user is then free to shape the in-plane pattern by choosing the complex-valued weights that each of the N-modes deposits at each of the T-locations.

Thus, the herein described method includes a method that designs a set of waveforms to drive all N=16 modes to form a desired excitation pattern. However, at the same time, it imposes a strong penalty whenever a mode waveform becomes nonzero. In this way, the method seeks out a smaller P-mode subset out of the N-available modes, where consequently P<N. This penalty enforces sparsity on the number of modes used and reveals a small subset of desired modes and corresponding waveforms.

To begin, waveforms for the T-spoke trajectories are produced to have a duration, L, where spoke locations are fixed at $k_1, \ldots, k_T$, in the $(k_x, k_y)$ plane. A small-tip-angle approximation is employed to create an approximate Fourier relationship between the energy deposited in k-space and the resulting excitation:

$$m(r) = i\gamma M_0 \sum_{n=1}^{N} S_n(r) \int_0^L b_{1,n}(t) e^{i\Delta B_0(r)(t-L)} e^{ir \cdot k(t)} dt; \quad \text{Eqn. (1)}$$

where $\gamma$ is the gyromagnetic ratio; $M_0$ is a steady-state magnetization; $S_n(r)$ is the complex-valued $B_1^+$ transmit profile of the $n^{th}$ coil; $b_{1,n}(t)$ is the RF pulse played along the $n^{th}$ coil; m(r) is an approximate transverse magnetization resulting from the transmission of the RF pulses, $b_{1,n}(t)$; $\Delta B_0(r)$ is a field map of $B_0$ inhomogeneity; $e^{\Delta B_0(r)(t-L)}$ is the phase accumulation resulting from the $B_0$ inhomogeneity; L is the RF pulse duration; and $$k(t) = -\gamma \int_t^L G(\tau) d\tau.$$

Eqn. (1) can be discretized in space and time at $N_s$ locations and at the T time instants where each of the T spokes are being traversed in the $(k_x, k_y)$ plane, respectively, to yield:

$$m = S_1 F g_1 + \ldots + S_N F g_N \quad \text{Eqn. (2)};$$

which may alternatively be expressed as:

$$m = [S_1 F \ldots S_N F] \begin{bmatrix} g_1 \\ \vdots \\ g_N \end{bmatrix} = A_{tot} g_{tot}; \quad \text{Eqn. (3)}$$

where $S_n$ is a diagonal matrix containing $N_s$ samples of the $N^{th}$ spatial profile within a user-selected field-of-excitation ("FOX"), or excitation pattern. Additionally, the matrix, F, incorporates the effects of the $B_0$ inhomogeneity and relates the energy deposited along a spoke in k-space to the corresponding spatial locations at the $N_s$ sample points where each coil is sampled. Formally:

$$F = i\gamma M_0 \Delta_t e^{i\Delta B_0(r)(t-L)} e^{ir \cdot k(t)} \quad \text{Eqn. (4)}$$

where $\Delta_t$ is the time-sample spacing of the RF waveforms, $b_{1,n}(t)$, which is chosen by the user and impacted by the digital-to-analog hardware parameters of the MR system's RF amplifier. Lastly, $g_n$ includes samples of the $n^{th}$ RF waveform, $b_{1,n}(t)$. Specifically, $g_n$, is a vector of size T×1 that contains the complex-valued (amplitude and phase) weights that the $n^{th}$ transmit mode places at the T k-space spoke locations.

Thus, Eqn. (1) describes the in-plane (x,y) excitation arising when the N-modes deposit energy at the T-spoke locations. The desired excitation, denoted d(r), is subsequently vectorized to form a vector of samples taken at the $N_s$ spatial locations, r. In order to determine weightings for each mode to place at each spoke location, the following system of equations is solved:

$$d = A_{tot} g_{tot} \quad \text{Eqn. (5);}$$

where d contains $N_s$ samples of the desired excitation pattern, d(r). One approach to solving Eqn. (5) is to use the solution $g_{tot}$ obtained via the pseudoinversion of $A_{tot}$:

$$g_{tot} = (A_{tot})^\dagger d \quad \text{Eqn. (6);}$$

where $(\ldots)^\dagger$ denotes the Moore-Penrose pseudoinverse. This approach reveals weightings that form an excitation quite close to the desired one, but results in the solution $g_{tot}$ where all N-modes deposit energy. In this situation, all $\|g_n\|_2$ (mode $L_2$-energies) are nonzero, thereby failing to reveal a useful small mode subset. Therefore, Eqn. (5) is instead solved while penalizing each nonzero mode energy, that is, each nonzero $\|g_n\|_2$. This explicitly prohibits the use of many modes, while encouraging those that do remain in use to still approximately solve Eqn. (5). This is achieved by solving the following:

$$\min_{g_{tot}} \left\{ \|d - A_{tot} g_{tot}\|_2^2 + \lambda \cdot \sum_n (\|g_n\|_2) \right\}; \quad \text{Eqn. (7)}$$

for a fixed value of a regularization parameter, $\lambda$, and where $$\sum_n (\|g_n\|_2)$$

is the $L_1$-norm of the $\|g_n\|_2$ mode energies. The $L_1$-norm is particularly advantageous since such a norm encourages sparsity. As the regularization parameter, $\lambda$, is increased from 0 to 1, increasing numbers of modes have their $\|g_n\|_2$ mode energies driven to zero (and are thus not used), residual error increases, and smaller subsets of modes and weightings are revealed. The method differs from prior methods because here sparsity is enforced on coil array modes rather than simply on the locations of the T-spokes. After solving Eqn. (7) using an appropriately selected value for $\lambda$, the P-modes whose $\|g_n\|_2$ energies are largest are selected to form the optimized P-mode subset, since these modes are determined from the above-described method as the most useful for forming the excitation. Finally, for a fixed P-mode subset, the weights in the corresponding P $g_n$ vectors are retuned by truncating the (N-P) non-chosen $S_n(r)$ and $g_n$ values from $A_{tot}$ and $g_{tot}$ and performing a least-squares fit to Eqn. (5).

Figure 4:
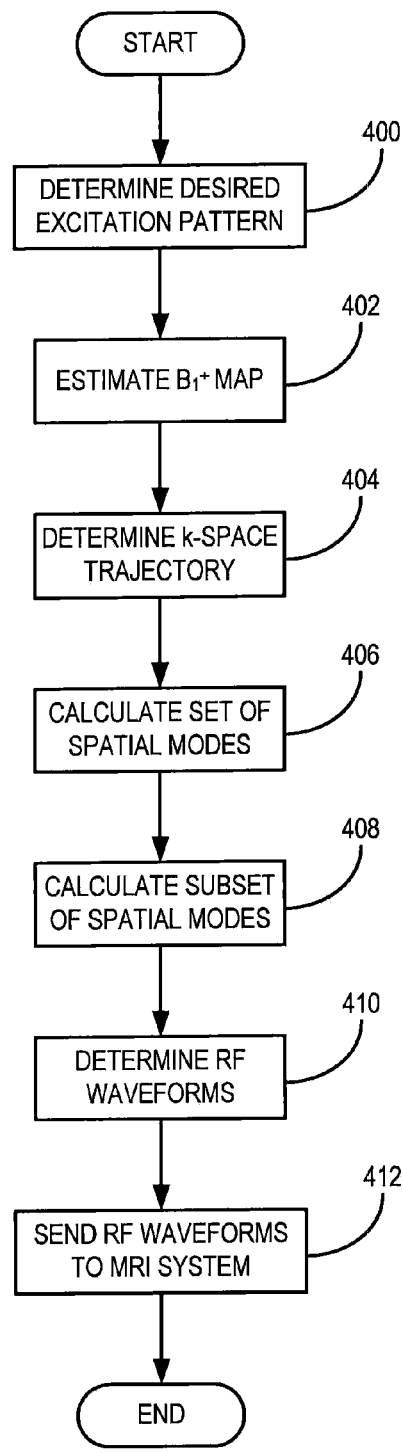
FIG. 4 is a flowchart setting forth the steps of an exemplary method for determining a subset of spatial modes of a radiofrequency ("RF") coil array that forms a part of the MRI system of FIG. 1.

Referring particularly now to FIG. 4, the determination of a subset of spatial profile modes to be employed by a transmit coil array begins by establishing a desired pattern of magnetization, d(r), as indicated at step 400. This is done, for example, by producing a vector, d(r), having values indicative of the spatial extent of a desired pattern of transverse magnetization that will result from an appropriate set of RF excitation pulses. By way of example, d(r) can be expressed as an image having pixel intensity values that correspond to the relative level of RF excitation to be applied to a spatial location corresponding to the pixel location in d(r). Next, transmission profile, or $B_1^+$, maps, $S_n(r)$, of the transmit array are estimated, as indicated at step 402. For example, a plurality of spatial profiles, $S_n(r)$, are determined; however, in the alternative, only one spatial profile need be determined. The estimation of the spatial profile, $S_n(r)$, is achieved, for example, using the estimation method described in co-pending U.S. patent application Ser. No. 12/422,017, entitled "Method for Fast Magnetic Resonance Radiofrequency Coil Transmission Profile Mapping," which is herein incorporated by reference in its entirety; however, in the alternative, other methods may be employed.

Using the desired excitation pattern, d(r), and $B_1^+$ maps, $S_n(r)$, the fixed k-space locations that define a trajectory in k-space that produces the desired pattern of magnetization, d(r), are determined, as indicated at step 404. For example, a set of k-space spoke locations is determined. This is achieved, for example, using the method described in co-pending U.S. patent application Ser. No. 12/422,512, entitled "Method for Joint Sparsity-Enforced k-Space Trajectory and Radiofrequency Pulse Design," which is herein incorporated by reference in its entirety; however, in the alternative, other methods may be employed.

Next, a set of P<N modes is determined, as indicated at step 406. As described above in detail, this is achieved by solving equation (7). In other words, from the determined set of N -spatial modes, a substantially optimized subset of P-spatial modes is determined, as indicated at step 408. By determining a subset of spatial modes that is smaller in number than number of RF coils in the transmission array, the transmission efficiency of the parallel transmission RF coil array is preserved while maintaining the fidelity of the desired transverse magnetization pattern, d(r). As described above, the mode subset is selected as the set of P spatial modes whose $\|g_n\|_2$ energies are the largest. Using only these P spatial modes, the RF excitation pulse waveforms that produce the desired pattern of magnetization are determined, as indicated at step 410. For example, the weights in the P $g_n$ vectors are retuned by truncating the (N-P) non-chosen $S_n(r)$ and $g_n$ values from $A_{tot}$ and $g_{tot}$, and performing a least-squares fit to Eqn. (5). Finally, the spatial mode information and RF excitation pulse waveforms are sent to the MRI system where they are played out to produce the desired pattern of transverse magnetization, as indicated at step 412.

In the foregoing manner, a subset of available spatial modes of an RF coil is selected and utilized to produce an RF excitation field that is high in fidelity relative to a desired pattern of excitation prescribed by a user. This, for example, provides a method for operating an RF coil array that has a limited number of transmission channels in an advantageous manner by controlling the trade-offs between RF excitation field quality, and the number and type of nonzero modes employed to produce the excitation.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for operating a radiofrequency (RF) coil array that includes a plurality of transmission channels and forms a part of a magnetic resonance imaging (MRI) system, the steps comprising:
   a) selecting a desired pattern of RF excitation;
   b) estimating an RF transmission profile map indicative of the transmission characteristics of the parallel transmission RF coil array;
   c) determining, from the desired pattern of RF excitation and the estimated RF transmission profile map, a plurality of k-space locations at which RF energy is to be deposited;
   d) calculating, from the determined k-space locations and the estimated RF transmission profile map, a sparse set of spatial modes indicative of a linear combination of transmission profiles of the RF coil array;
   e) selecting, from the calculated set of spatial modes, a subset of spatial modes; and
   f) producing, with the RF coil array and using the selected subset of spatial modes, an RF excitation field characterized by the desired pattern of RF excitation.

2. The method as recited in claim 1 in which step d) includes performing an iterative minimization that enforces sparsity on the calculated set of spatial modes.

3. The method as recited in claim 1 in which step d) includes performing an iterative minimization that penalizes nonzero mode energies.

4. The method as recited in claim 1 in which step e) includes selecting a preselected number of spatial modes having the largest mode energies.

5. The method as recited in claim 1 in which step f) includes:
   f)i) calculating an RF excitation pulse waveform using the subset of spatial modes selected in step e); and
   f)ii) producing the RF excitation field with the calculated RF excitation pulse waveform while driving the RF coil at the selected subset of spatial modes.

6. The method as recited in claim 5 in which k-space weightings defined by the remaining spatial modes are employed to calculate the RF excitation pulse waveform.

7. The method as recited in claim 1 in which the determined plurality of k-space locations is a sparse set of k-space locations.

8. The method as recited in claim 1 further comprising:
   g) acquiring, with the MRI system, image data from a subject using the produced RF excitation field; and
   h) reconstructing an image of the subject from the acquired image data.

9. A method for determining a set of spatial modes for a parallel transmission radiofrequency (RF) coil array that forms a part of a magnetic resonance imaging (MRI) system, the steps comprising:
   a) selecting a desired pattern of RF excitation;
   b) determining, from the desired pattern of RF excitation, a plurality of k-space locations at which RF energy is to be deposited;
   c) estimating an RF transmission profile map indicative of the transmission characteristics of the parallel transmission RF coil array;
   d) calculating, from the determined k-space locations and the estimated RF transmission profile map, a sparse set of spatial modes indicative of a linear combination of transmission profiles of the parallel transmission RF coil;
   e) selecting, from the calculated set of spatial modes, a subset of spatial modes that are employed to produce the desired pattern of RF excitation
   f) acquiring, with the MRI system, image data from a subject using the selected subset of spatial modes and calculated sparse set of spatial modes; and
   g) reconstructing an image of the subject using the acquired image data.

10. The method as recited in claim 9 in which step d) includes performing an iterative minimization that penalizes nonzero mode energies.

11. The method as recited in claim 9 further comprising:
    h) calculating an RF excitation pulse waveform that produces the desired pattern of RF excitation when driven by the subset of spatial modes calculated in step e).

12. The method as recited in claim 11 in which the calculation of the RF excitation pulse waveform in step h) includes using the subset of spatial modes selected in step e).

13. The method as recited in claim 12 in which k-space weightings defined by the remaining spatial modes are employed to calculate the RF excitation pulse waveform.

14. The method as recited in claim 9 in which the determined plurality of k-space locations is a sparse set of k-space locations.

* * * * *